United States Patent
Cronin et al.

(10) Patent No.: US 6,576,848 B1
(45) Date of Patent: Jun. 10, 2003

(54) INTEGRATED CIRCUIT CHIP WIRING STRUCTURE WITH CROSSOVER CAPABILITY AND METHOD OF MANUFACTURING THE SAME

(75) Inventors: John Edward Cronin, Milton, VT (US); John Andrew Hiltebeitel, South Burlington, VT (US); Carter Welling Kaanta, Colchester, VT (US); James Gardner Ryan, Newtown, CT (US)

(73) Assignee: International Business Machines Corporation, Armonk, NY (US)

( * ) Notice: Subject to any disclaimer, the term of this patent is extended or adjusted under 35 U.S.C. 154(b) by 858 days.

(21) Appl. No.: 08/755,052

(22) Filed: Nov. 22, 1996

(51) Int. Cl.[7] .................................................. H01R 9/09

(52) U.S. Cl. .................... 174/261; 174/262; 174/264; 361/767; 361/771

(58) Field of Search ................. 174/250, 261, 174/262, 264, 255; 361/784, 795, 803, 767, 771, 777, 779; 257/700, 701, 786, 723, 758, 759, 752

(56) References Cited

U.S. PATENT DOCUMENTS

| | | | |
|---|---|---|---|
| 3,366,519 A | 1/1968 | Pritchard | 216/16 |
| 4,746,621 A | 5/1988 | Thomas et al. | 438/624 |
| 4,776,087 A | 10/1988 | Cronin et al. | 29/828 |
| 4,962,058 A | 10/1990 | Cronin et al. | 438/622 |
| 4,985,990 A | 1/1991 | Cronin et al. | 216/18 |
| 4,987,101 A | 1/1991 | Kaanta et al. | 438/619 |
| 4,997,746 A | 3/1991 | Greco et al. | 430/314 |
| 5,021,869 A * | 6/1991 | Kaw | 257/700 |
| 5,136,124 A | 8/1992 | Cronin et al. | 174/261 |
| 5,144,411 A | 9/1992 | Kaanta et al. | 257/701 |
| 5,169,802 A | 12/1992 | Yeh | 438/637 |
| 5,229,257 A | 7/1993 | Cronin et al. | 430/315 |
| 5,258,891 A * | 11/1993 | Sako | 257/700 |
| 5,408,053 A * | 4/1995 | Young | 174/264 |
| 5,654,590 A * | 8/1997 | Kuramochi | 257/723 X |
| 5,834,845 A * | 11/1998 | Stolmeijer | 257/752 |

FOREIGN PATENT DOCUMENTS

| | | | |
|---|---|---|---|
| EP | 86114396.4 | 10/1986 | |
| GB | 1035592 | 2/1965 | 426/619 |
| JP | 59-161048 | 9/1984 | |
| JP | 8-204333 | * 8/1996 | |

OTHER PUBLICATIONS

Barsuhn et al. "Reducing the number of short circuits in double–layer wafer metallizations", IBM Technical Disclosure Bulletin, vol. 16. No. 10 Mar. 1974, P3273.*

H.H. Berger, Conductor Crossings in Monolithic Circuits, Feb., 1971, vol. 13, No. 9.

W.J. Cote, J.E. Cronin, R.E. Scheuerlein, Customized Metallization for Low Capacitance or Low Resistance, Nov., 1985, vol. 28, No. 6.

(List continued on next page.)

*Primary Examiner*—Albert W. Paladini
(74) *Attorney, Agent, or Firm*—Schmeiser, Olsen & Watts; Ira D. Blecker (57) ABSTRACT

A wiring structure with crossover capability is disclosed. The wiring utilizes a connection stud in a contact layer, beneath the plane of the otherwise-intersecting lines as a crossover. Thus, a first wire in a first metallization layer passes below a second wire in a second metallization layer by overlapping contact with the connection stud in the contact layer. In manufacturing the wiring structure of the present invention, no intervening insulative or via layers are used between the contact layer, the first metallization layer and the second metallization layer. However, care must be taken in device layout on the substrate to ensure that the connection stud is located above isolation areas rather than active device areas.

7 Claims, 5 Drawing Sheets

OTHER PUBLICATIONS

J.E. Cronin, C.W. Kaanta, Variable Depth Contact Hole Preparation Utilizing a Nucleation Layer and Selective Chemical Vapor Deposition for Stud Formation, Jun., 1986, vol. 29, No. 1.

J.E. Cronin and R.A. Horr, Optical Thickness Monitor for Continuous Vapor Deposited Film, Aug., 1986, vol. 29, No. 3.

J.E. Cronin, Chemical Vapor Deposition of Tungsten to Fill Oversize Vias, J.E. Cronin, Dec., 1986, vol. 29, No. 7.

J.E. Cronin and C.W. Kaanta, Modification of Interlevel Via Design to Lower Line Resistivity, Mar., 1987, vol. 29, No. 10.

J.E. Cronin and C.W. Kaanta, Method for Obtaining Low Resistance and Low Capacitance Metallization Using Single Metal Deposition, May, 1988, vol. 30, No. 12.

J.E. Cronin, S.P. Hollard and C.W. Kaanta, Optimum Metal Line Structures for Memory Array and Support Circuits, May, 1988, vol. 30, No. 12.

D.B. Eardley and P.T. Liu, Using Contact Studs Alone for Short Interconnections in Memory Cells, May, 1988, vol. 30, No. 12.

W.J. Cote, J.E. Cronin, K.L. Holland and C.W. Kaanta, Reliable and Extendable Wiring Process for Logic, Oct., 1988, vol. 31., No. 5.

J.E. Cronin and P.A. Farrar, Elimination of CMOS Electromigration–Induced Extrusions, Nov., 1988, vol. 31, No. 6.

J.E. Cronin, K.L. Holland and C.W. Kaanta, Materials, Masking and Etching Technique for Fabricating Semiconductor Stud–Up Interconnections, Aug., 1989, vol. 32, No. 3A.

* cited by examiner

INTEGRATED CIRCUIT CHIP WIRING STRUCTURE WITH CROSSOVER CAPABILITY AND METHOD OF MANUFACTURING THE SAME

TECHNICAL FIELD

This invention generally relates to the manufacturing of integrated circuit chip wiring structures, especially dynamic random access memory (DRAM) chips, and more specifically relates to a method of producing these chips without the use of vias between some layers, while still providing cross-over and contact capabilities.

BACKGROUND OF THE INVENTION

Integrated circuit (IC) chips, for example dynamic random access memory (DRAM) and static random access memory (SRAM), require different resistance and capacitance limits in the cell array wiring and the sense amplifier/decode and support circuits. In the array wiring, the conductor is customized for low capacitance. For example, in a typical 4 Megabit(M) DRAM the capacitance (C) is less than or equal to ($\leq$) 0.15 femptofarads per micron (ff/$\mu$m) in bitline-to-bitline wiring at the expense of resistance (R), which is less than or equal to 1 ohm per square ($\Omega/\square$). On the other hand, in the supports and decode circuits (the logic circuits), the resistance is optimized (R$\leq$0.07 $\Omega/\square$), while capacitance is less crucial (C$\leq$0.25 ff/$\mu$m).

In order to achieve these resistance and capacitance limits, the pitch, which is defined as the width of the line plus the space between the lines, of the wiring structure must be carefully controlled. In order for the wiring to be suitable for the array requirements (capacitance and resistance), the pitch must be as near as possible to the smallest photolithographically achievable size (minimum pitch). Although some minimum pitch wiring is needed in the supports, for the most part the logic circuitry has a pitch about two times the minimum pitch in order to carry the signals with the requisite lower resistance. Various ways of creating the necessary line widths have been suggested. See Cronin, J. and C. Kaanta, "Thickness Controlled Thick and Thin Lines in One Damascene Level", *IBM Technical Disclosure Bulletin* (TDB) No. 7, at 393–94 (Dec. 1990); Cronin, John, "Method to Make Thin and Thick Lines Within a Single Level of Damascene Wiring Using a Single Photomask", *IBM TDB* No. 7 at 387 (Dec. 1990); Cronin et al., "Optimum Metal Line Structures for Memory Array and Support Circuits", *IBM TDB* Vol. 30, No. 12, at 170–71 (May 1988); Cronin et al., Method for Obtaining Low Resistance and Low Capacitance Metalization (Sic) Using Single Metal Deposition, *IBM TDB* Vol. 30, No. 12, at 142–43 (May 1988); and Anonymous, Process to Make Thick and Narrow Conductive Lines, *IBM Research Disclosure*, No. 313 (May 1990)

Figure 1:
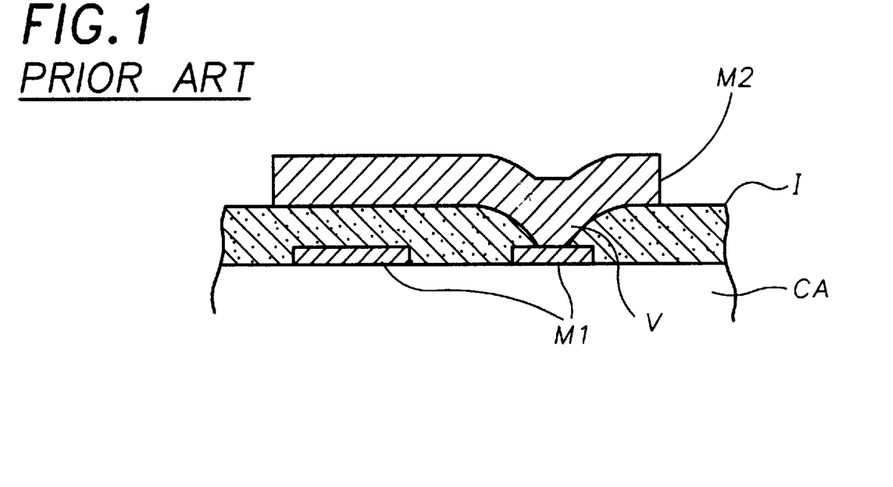
FIG. 1 is a prior art schematic of tapered via.

As shown in FIG. 1, the necessary line widths were initially constructed by depositing and defining a first metal layer Ml that was thin, covering the first metal layer M1 by depositing a layer of an insulating material I, followed by depositing and defining a second metal layer M2 that was thick. Contacts between the first and second metal layers M1, M2 were formed by etching a tapered via V through the insulator I and then depositing the second metal layer M2 over the insulator I. Thus, contact was made between the first and second layer M1, M2 through the tapered via V.

Figure 2:
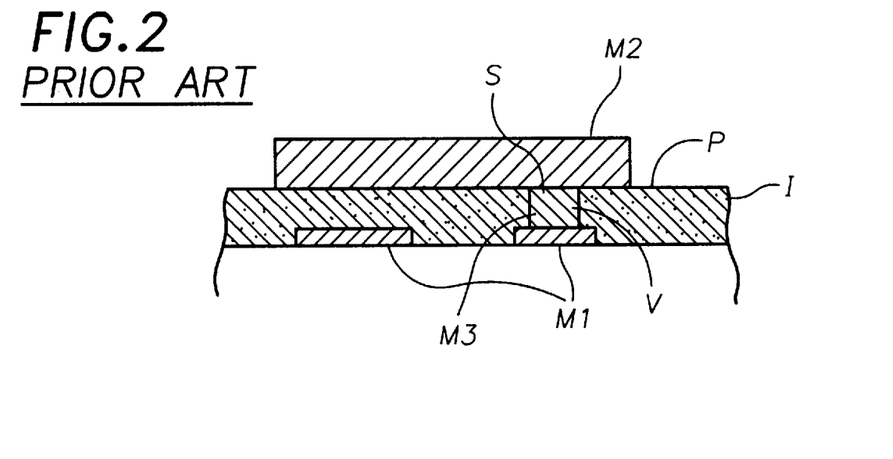
FIG. 2 is a prior art schematic of a stud via.

It was then found that a planarized layer of insulative material was desirable for improved photolithographic resist image definition (the planar surface minimized depth of field problems). FIG. 2 illustrates the solution wherein a first metal layer (thin) M1 was deposited and defined. The insulator I was next deposited over the entire surface and planarized. Studs S were formed by etching a vertical via V through the insulator layer I, depositing a stud via metal M3 therein, and planarizing the surface. The second metal layer (thick) M2 was then applied and patterned so that connection between first and second metal M1, M2 was made through the stud via S.

Figure 3:
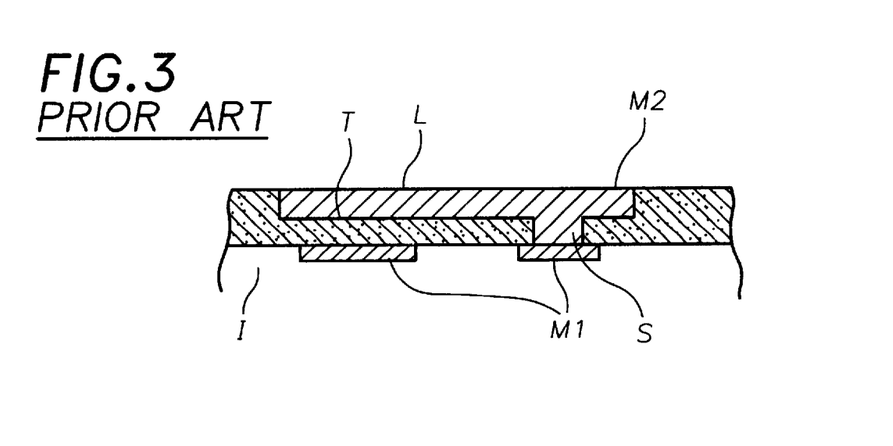
FIG. 3 is a prior art schematic of a dual damascene via.

As shown in FIG. 3, further improvements to minimize cost by eliminating processing steps and materials were made by combining the stud via metal with the second metal layer M2. In this method, the first metal layer (thin) M1 was defined and deposited followed by an insulator layer I which was deposited and planarized. The second metal layer's M2 wiring lines in the insulator I were defined as trenches T and stud vias S were defined as holes H. Metal was deposited to fill the trenches T and holes H and the metal was then planarized. (see also FIG. 13). By defining the trenches T first and then the studs S, before metallizing, the one metal deposition filled both the trenches T and holes H thereby saving costs. This approach to wiring is known as the "damascene approach".

The "damascene" approach to wiring is well known in the industry. It comprises depositing an insulator over the semiconductor device structures, e.g. M1. Next, the insulator is planarized by a chemical-mechanical polish (CMP) process. A resist material is applied, exposed to an energy source, and developed, leaving openings in certain regions. These openings define wiring channel regions/trenches. The insulator exposed in the resist openings is subjected to a reactive ion etch (RIE) to remove the exposed areas of insulator. The remaining resist material is then removed, leaving the planar insulator with channels or trenches cut into it. A conformal metal is applied over the entire surface, filling all the trenches and covering all the insulator surfaces. The metal is removed by a planarization, e.g., a CMP, process. The metal is only left in the trenches, forming wiring channels.

Adding a via level requires extra layers which must be sequentially defined. Each additional step to the process requires another alignment step, which increases the likelihood of failure of the final product. Additionally, each processing step requires further handling of the chips which increases cycle time. By reducing the number of steps and layers, there is a reduction in handling and delays, which also tends to increase the yield of the chips because there are fewer defects introduced through handling. In addition, yield is enhanced by the elimination of process variables related to the uncontrolled delays which are created when the chips are processed with several extra steps in the production line. The processing characteristics of the materials used in the production of the chips can vary depending on extent of time elapsed from one processing step to the next. By reducing the number of steps, these delays are reduced and more repeatable, thus reducing process variability. These increases in yield result in cost savings to the manufacturer. Additionally, the removal of the intervening insulator results in cost savings both because of the reduced material costs and because of the reduced handling costs.

In the manufacture of dynamic random access memory ("DRAM") chips, containing the costs of production is essential. One way of reducing cost is to eliminate as many process steps as possible. One possibility is to eliminate a separate, trapped via level between the first metal and the second metal, if possible. Typically the first metal is a thin layer while the second metal is thick. Since the thin metal is required only in the DRAM array for low capacitance and the thick metal is required in the supports for low resistance, one could limit the design rules so that a cross-over between the thin and thick lines is not required and therefore a via connection between the thick and thin layers is not required. However, it should be noted that a via level between two wiring levels allows the two levels to cross each other, and connect when a via is defined at the cross-over, but not connect if there is no via at the cross-over.

Figure 4:
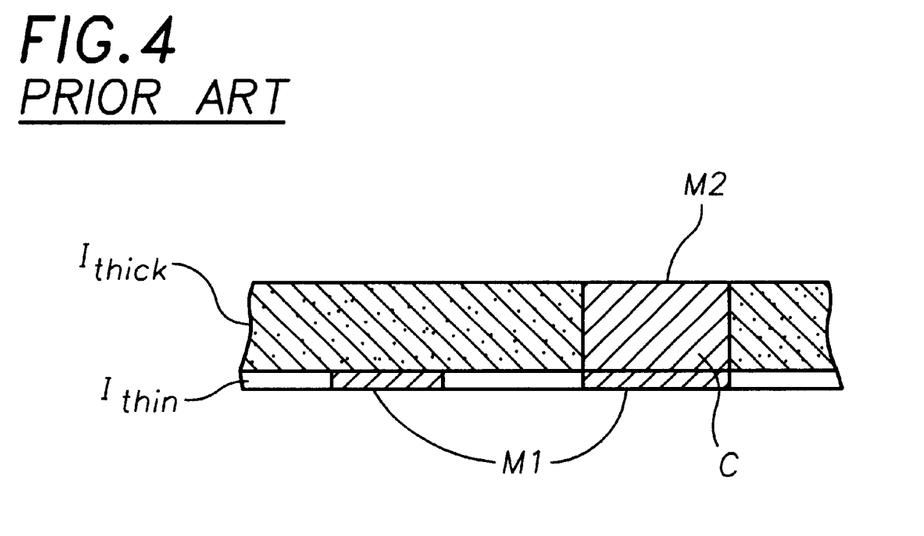
FIG. 4 is a prior art schematic of a "multi-damascene" approach showing an area where connection is made.
Figure 5:
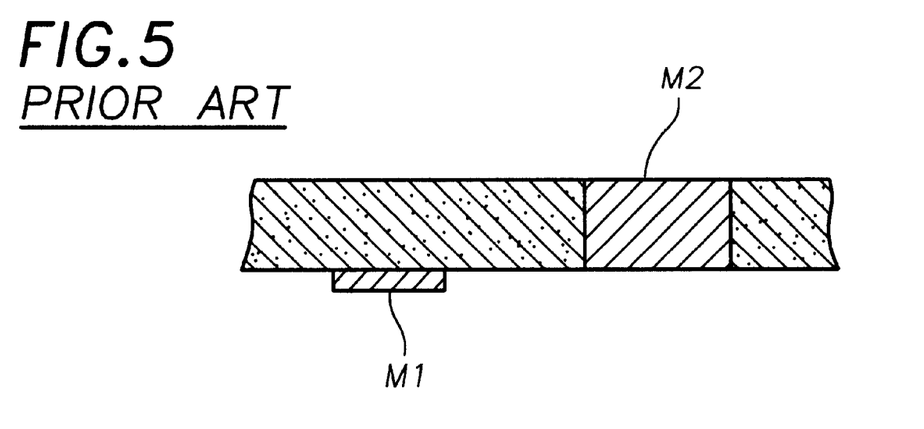
FIG. 5 is a prior art schematic of the "multi-damascene" approach showing an area without contact.

FIGS. 4 and 5 show two variations of an approach called the "multi-damascene" approach, that create thick and thin wiring levels without both a separate, trapped via level and cross-over capability. The method, as shown in the FIGS. 4 and 5, creates thin lines M1 by the damascene method in a thin insulator $I_{thin}$, followed immediately by a second, thick line M2 in a thick insulator $I_{thick}$ by the damascene method. Where the thin and thick lines M1, M2 cross, at the intersection, they electrically connect C. A via which is normally used between the thin line and the thick line, is left out, since crossing over without connection is not needed in the DRAM design case. By removing the intervening insulator and via connection level, cost is reduced. However, there are times in more complex, logic intensive DRAMs (high density synchronomous DRAMs and video DRAMs) when some amount of cross-over is necessary.

That is, standard interconnection systems use two levels of damascene, a first level and a second level. These levels are insulated from each other by an intervening insulator material. When a second level crosses over a first level, no electrical connection is made because the levels are insulated from each other by the intervening insulator. When electrical connection is required between the first and second level, a conductive via is defined in the intervening insulator at the intersection where electrical connection is to be made. This gives the designer total wiring flexibility and is, therefore, more desirable than the previous instance, in which every time crossover occurs, there is electrical connection.

Other ways of obtaining thick and thin lines were explored including, manufacturing the chip to have the thick and thin lines in different areas of the chip, so they were decoupled from each other. The lines were either manufactured as part of the same plane, as shown in IBM TDB Vol. 30, No. 12 at 142-43 (May 1988) or, using various methods, as a thick portion and a thin portion in different planes, as discussed above. Typically, wherever the lines were there was no via between them. On the other hand, whenever connections were needed, the vias were used with a layer of an insulative material between the two metallization planes. As can be seen, the methods described of creating the thick lines in one area and thin lines in a different area either: a.) consume a lot of "real estate" on the chip surface or b.) do not allow cross-over unless an intervening insulative layer is used, in which case the vias were necessary.

There exists a need for a structure in which the second level is normally insulated from the first level at cross-overs, but a via would not be required when the electrical connection of the thin and thick lines was desirable. This specific case occurs in DRAM and SRAM circuits, where two wiring levels are needed for electrical design considerations, i.e., low capacitance (thin) array wiring and low resistance (thick) support wiring. These thick and thin levels are defined by the damascene technique. When some insulated cross-over of thin and thick lines is needed, particularly in those regions between arrays and for running thick power buses in the array, it would be most effective to do so without the need for an entire level of via wiring (insulator/mask/via/conductor). Fortunately, these insulative cross-over regions do not require the layout considerations (density) that adding a via would allow for. Therefore, a method for wiring thin and thick wires with some low density (large layout area) cross-over capability is needed.

SUMMARY OF THE INVENTION

The present invention is a novel integrated circuit (IC) chip wiring structure and the method for producing it. The IC chip's wiring structure is laid out in such a manner that the thick or low resistance plane may cross over the thin or low capacitance plane by manipulating the design of the interconnect structure and/or device layout on the substrate. The use of vias, with the associated mask alignment problems, processing steps and associated costs, is obviated by this new method of applying the various layers to the substrate surface.

The method consists of using an already existing underpass and designing the metal levels. This process is performed simultaneously with the contact layer metal. A main layer of wiring and passivating material is then applied, which may be thick or thin but is typically a thin layer, with some of the connections being made by simple overlap with the metallized areas of the contact metal. The contact metal connections would be utilized whenever crossover without contact with a third or upper layer was desired. The third layer, typically of the opposite thickness of the main layer, is then applied, patterned, and etched in the desired areas. The third layer is metallized and all crossover areas for the main layer should then be complete, the passivating areas of the main layer insulating the first layer from the third layer. The third layer can crossover the contact layer without "contact".

Numerous other advantages and features of the present invention will become readily apparent from the following detailed description of the invention, the drawings, and the appended claims.

DETAILED DESCRIPTION OF THE PREFERRED EMBODIMENT

While this invention is susceptible to embodiment in many different forms, there is shown in the drawings and will be described in detail, a preferred embodiment of the invention. It should be understood, however, that the present disclosure is to be considered as an exemplification of the principles of this invention and is not intended to limit the invention to the embodiment illustrated.

Figure 6:
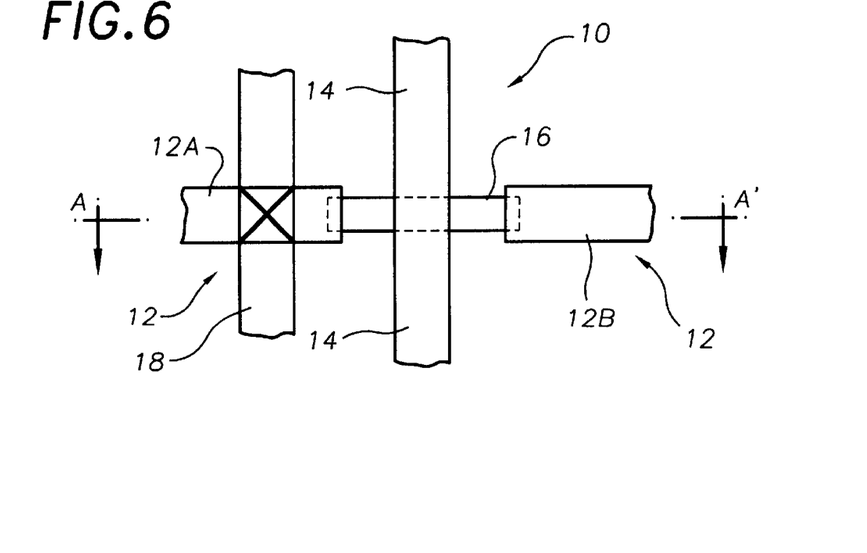
FIG. 6 is a schematic of a cross-over in a wiring structure embodying the present invention from the top.

A wiring structure 10 of the present invention is shown in FIG. 6. A first wire/line 12 and a second wire/line 14 are shown with the first wire 12 running in an east-west direction and the second wire 14 running in a north-south direction. The first wire comprises a first leg 12A, a second leg 12B, and a connection stud 16. A third wire 18 runs parallel to the second wire 14 but, in this case, connection between the first wire 12 and the third wire 18 is made, as indicated by the "X".

Referring now to FIGS. 7–16, there is shown a stepwise series of cross-sectional schematics depicting a preferred method of arriving at the final structure, as shown in FIG. 6. Each view is taken across line A–A' of FIG. 6 at various stages of production.

Figure 7:
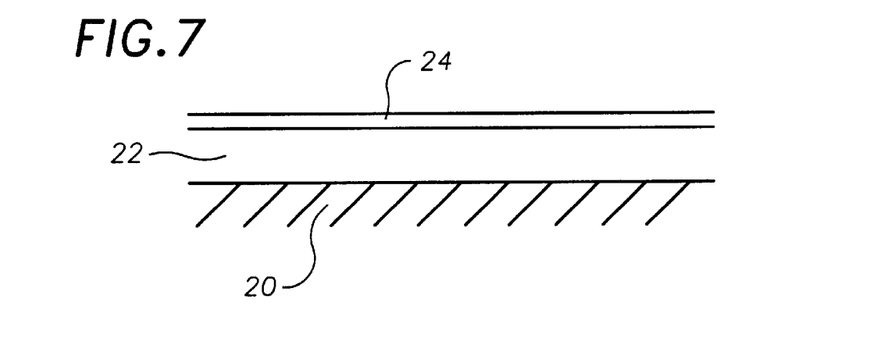
FIGS. 7–16 are cross-sectional schematics taken across line A–A' of FIG. 6 depicting in a step-wise fashion a method of manufacturing the cross-over in the wiring structure embodying the present invention.

FIG. 7 shows the first step of the progression. An insulative substrate 20 is provided on top of which a layer of a first insulative material 22 is applied. The first insulative material 22 is preferably a borophospho-silicate glass, however, other reflowable insulating or passivating materials may also be used. The first insulative material 22 may be applied in a number of different ways such as chemical vapor deposition ("CVD") and physical vapor deposition ("PVD"). The most preferred of these methods is CVD. A first photoresist layer 24 is applied to a surface of the first insulative material 22 in the desired manner, typically a spin apply.

Figure 8:
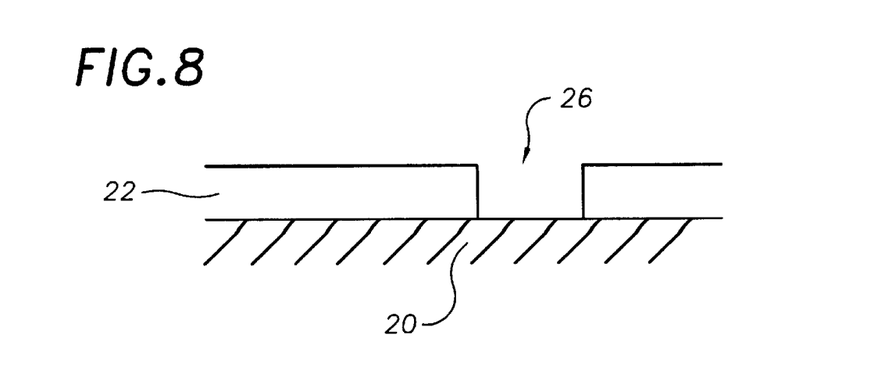

The first photoresist layer 24 is exposed and developed, and the first insulative material 22 is etched to form the pattern that will subsequently be metallized. This step-wise progression of forming the appropriate pattern to metallize will hereinafter be referred to as "defining" the area to be metallized. As shown in FIG. 8, the first photoresist layer 24 is then stripped from the surface of the first insulative material to form a hole or trench 26. The process steps (not shown) are normally carried out to create contacts between silicon devices below and wiring levels above. When used for the present invention, care must be taken during device layout to ensure the connection studs in-the contact layer are only located above isolation areas of the substrate and not areas where devices occur.

Figure 9:
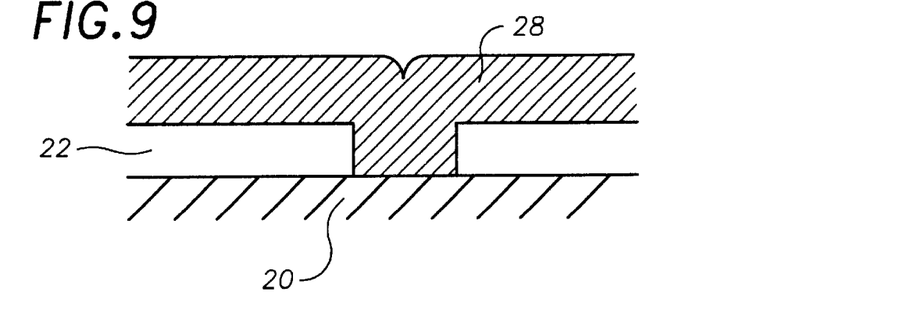

As shown in FIG. 9, stud metallization 28 is then applied across the entire surface of the first insulative material 22 and also filling the hole 26. The application of the stud metallization 28 is accomplished by any one of a number of methods commonly known in the art, preferably by PVD, such as evaporation or sputtering, CVD or by plating. The exposed surface is preferably coated with a layer of metallization 28 that is at least half as thick as the hole 26 is wide. The stud layer 28 may comprise a number of different conductive metals as known in the art. Preferred metals include CVD tungsten (W), titanium (Ti), aluminum (Al), copper (Cu), Al—Cu, titanium nitride (TiN), Ti—Al—Cu, and tantalum copper (Ta-Cu).

Figure 10:
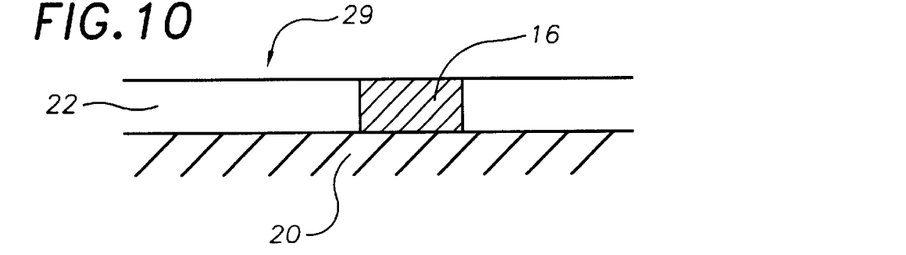

As shown in FIG. 10, the stud layer that overlies the layer of the first insulative material is removed to coplanarize the surfaces of the stud layer 28 and the first insulative material 22. Thus forming a connection stud 16 in the layer of first insulative material 22. The combination of the connection studs and first insulative material is collectively referred to as a contact layer 29. This may be accomplished by damascene method, which are commonly known in the art, as described above.

Figure 11:
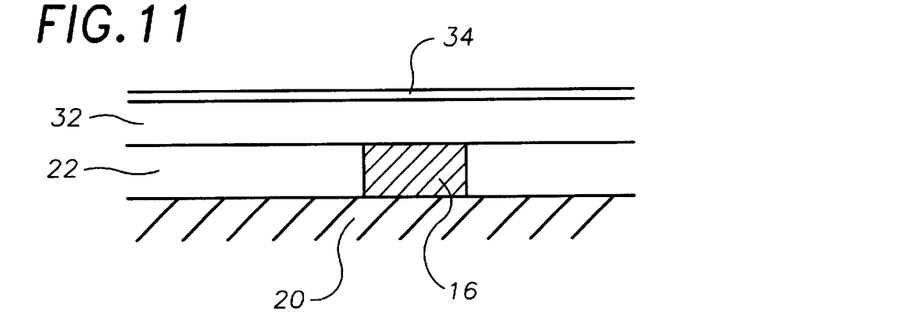

As shown in FIG. 11, a second layer of insulative material 32 and a second photoresist layer 34 are deposited in the same manner as the first layer of insulative material 22 and first photoresist 24 overlying the contact layer 29 i.e., the coplanar connection stud 16 and first insulative material 22. This second insulative layer 32 may either be a thick layer or a thin layer, whichever is desirsed. For illustration purposes, a thin layer of insulative material and wiring material having a first pitch is shown for transmitting electrical current at relatively low capacitance.

Figure 12:
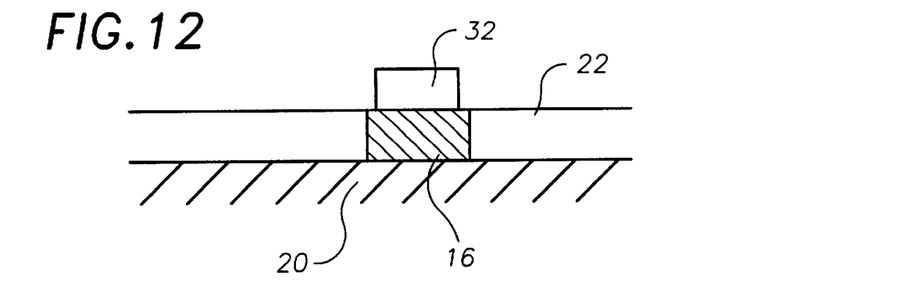

As shown in FIG. 12, the second photoresist layer is exposed and developed, the second layer of insulative material 32 is etched, and the photoresist layer is removed. The areas that are removed will form the first wire 12 in the wiring structure 10, as shown running in the east-west direction in FIG. 6. The selective etching process is a repetition of the process described above and is well known by those skilled in the art.

Figure 13:
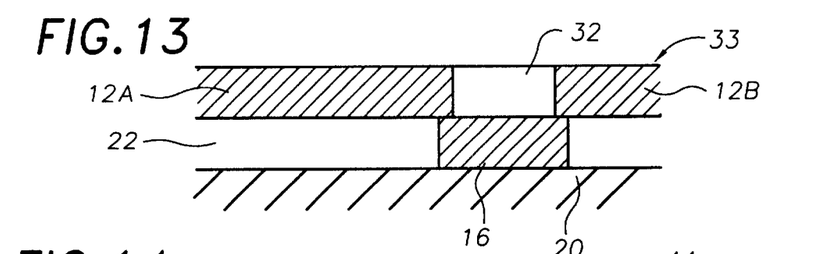

As shown in FIG. 13, the etched portions are metallized and the excess metal removed in the same manner as described above thereby forming a first metallization layer 33. The first leg 12A of the first wire 12 is shown overlapping a first end of the connection stud 16. The second leg 12B of the first wire 12 is shown overlapping a second end of the connection stud 16. The first and second legs 12A and 12B are spaced from each other by the insulative material 32 and are not in direct contact with each other, i.e., first and second legs 12A and 12B do not touch each other. In this manner, electrical connection is made between the first leg and the second leg 12A and 12B without the use of vias, the necessary alignment steps and another layer of a passivating material between the contact layer and the first metallization layer.

Figure 14:
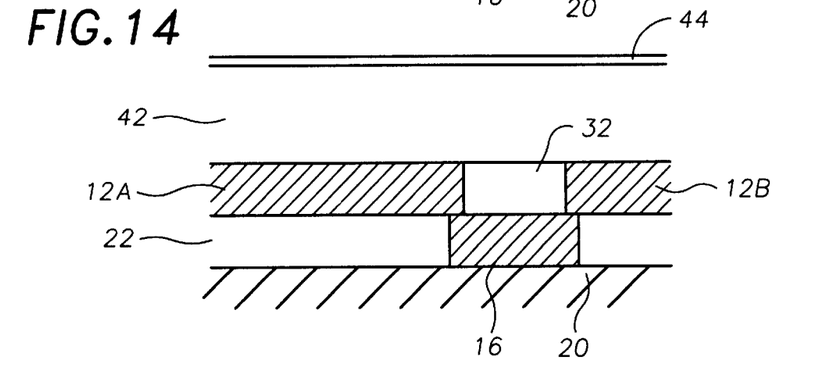

As shown in FIG. 14, a third layer of an insulative material 42 is then applied to the surface of the second layer on top of the first leg 12A, the second insulative material 32 and the second leg 12B, i.e., the first metallization layer 33. This third layer of insulative material 42 and wiring material 14, 18 is shown as a thick layer (see also FIG. 16) typically two times as thick as the thin layer for transmitting electrical current at relatively low resistance, albeit a thin layer could be used if appropriate. A third photoresist material 44 is then applied to the surface of the third layer of insulative material 42.

Figure 15:
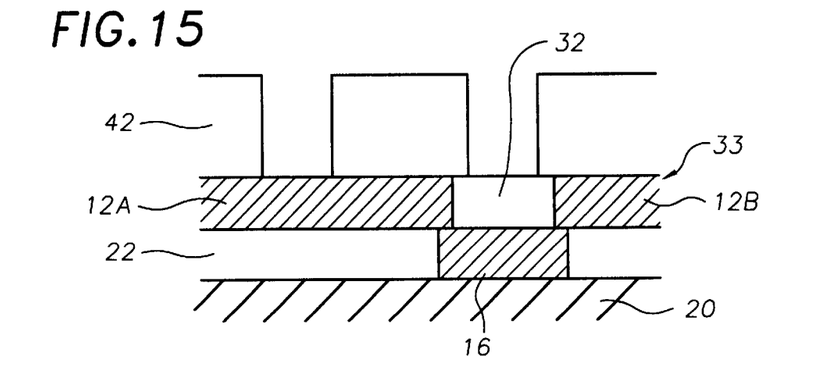

As shown in FIG. 15, the third photoresist material is patterned so as to etch openings wherever metallization is desired in the third layer, the openings are etched and the third photoresist material is stripped off. The metallization is used for the north-south lines.

Figure 16:
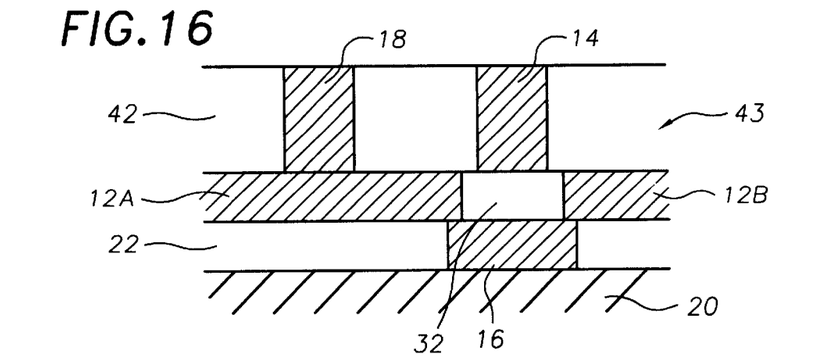

As shown in FIG. 16, the metal is deposited over the entire surface and then planarized to give a second metallization layer 43, resulting in a wiring structure. The metal forms second wire 14 and third wire 18, as shown in FIG. 6, which run in the north-south direction.

It should be understood that this wiring structure could be presented in a number of different ways. For example, the thin layer could be the third layer and the thick layer could be the second layer. The connection stud layer could be a completely separate layer above the third layer, i.e., a fourth layer, however, it should be noted that the present embodiment lends itself well to the manufacturing process of IC chips because these layers are used presently and are simply being adapted for the purpose of removing steps in the process. Additionally, the main wires need not run north-south and east-west, this has been done merely as a matter of convenience and for the sake of clarity in description. The only restriction on the directionality of the main wires is that there must be two pairs which would otherwise intersect. These main wires are not connected to the connection stud and the connection portion by means of vias, instead they are electrically connected by direct contact achieved by selective overlapping of the layers.

The foregoing specification is intended as illustrative and is not intended to be taken as limiting. Still other variations within the spirit and scope of this invention are possible and will readily present themselves to those skilled in the art.

Accordingly, what is claimed is:

1. A wiring structure comprising:

a first planar wire in a first planar metallization layer, wherein the first planar wire has a first leg and a second leg spaced apart by an insulative material;

a second planar wire in a second planar metallization layer, wherein the second planar metallization layer is in direct contact with the first planar metallization layer, and wherein the second planar wire crosses the insulating material and is electrically insulated from the first and second legs of the first planar wire, and wherein the first planar wire is configured for transmitting electrical current at a lower capacitance than the second planar wire and wherein the second planar wire is configured for transmitting electrical current at a lower resistance than the first planar wire; and a connection stud in a contact layer wherein the first and second legs of the first planar wire are in electrical connection with the connection stud.

2. A wiring structure comprising:

a first planar wire in a first planar metallization layer, wherein the first planar wire has a first leg and a second leg spaced apart by an insulative material;

a second planar wire in a second planar metallization layer, wherein the second planar metallization layer is in direct contact with the first planar metallization layer, and wherein the second planar wire crosses the insulating material and is electrically insulated from the first and second legs of the first planar wire; and a connection stud in a contact layer wherein the first and second legs of the first planar wire are in electrical connection with the connection stud, wherein the contact layer is formed directly on a surface of a substrate, and wherein the substrate is an isolation area when there is a connection stud in the contact layer.

3. A method of manufacturing a wiring structure comprising the steps of:

providing a substrate;

depositing and defining a contact layer including at least one connection stud having a first end and a second end;

depositing and defining a first planar metallization layer including a first planar wire having first and second legs spaced apart by an insulative material, wherein the first leg of the first planar wire is in electrical contact with the first end of the connection stud and the second leg of the first planar wire is in electrical contact with the second end of the connection stud; and depositing and defining a second planar metallization layer directly against the first planar metallization layer, the second planar metallization layer including a second planar wire that crosses the insulative material and is electrically insulated from the first and second legs of the first planar wire, wherein the second metallization layer further includes a third planar wire and wherein the third wire is in electrical contact with the first wire in the first metallization layer.

4. The method of claim 3, wherein the substrate includes a plurality of isolation areas and wherein the method further comprises the step of designing the wiring structure so that the connection stud is located on one of the isolation areas.

5. An electrical apparatus comprising an integrated circuit chip, wherein the integrated circuit chip includes a wiring structure having:

a first planar wire in a first planar metallization layer wherein the first planar wire has a first leg and a second leg spaced apart by an insulative material;

a second planar wire in a second planar metallization layer wherein the second planar metallization layer is in direct contact with the first planar metallization layer, and wherein the second planar wire crosses the insulating material and is electrically insulated from the first and second legs of the first planar wire, wherein the first planar wire is configured for transmitting electrical current at a lower capacitance than the second planar wire and wherein the second planar wire is configured for transmitting electrical current at a lower resistance than the first planar wire; and a connection stud, having a first end and a second end, in a contact layer wherein the first and second legs of the first planar wire are in electrical connection with the connection stud, wherein the first leg of the first planar wire directly contacts the first end of the connection stud and wherein the second end of the connection stud directly contacts the second leg of the first planar wire.

6. The electrical apparatus of claim 5 further comprising a third planar wire in the second metallization layer, wherein the third planar wire is in electrical connection with the first planar wire.

7. The electrical apparatus of claim 1 wherein the contact layer is on a surface of a substrate, and wherein the substrate is an isolation area when there is a connection stud in the contact layer.

* * * * *